United States Patent
Tu et al.

(10) Patent No.: US 8,513,039 B2
(45) Date of Patent: Aug. 20, 2013

(54) METHOD FOR FABRICATING SEMICONDUCTOR LIGHTING CHIP

(75) Inventors: Po-Min Tu, Hsinchu (TW); Shih-Cheng Huang, Hsinchu (TW); Tzu-Chien Hung, Hsinchu (TW); Ya-Wen Lin, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 223 days.

(21) Appl. No.: 13/216,260

(22) Filed: Aug. 24, 2011

(65) Prior Publication Data

US 2012/0164773 A1 Jun. 28, 2012

(30) Foreign Application Priority Data

Dec. 28, 2010 (CN) .......................... 2010 1 0606544

(51) Int. Cl.
*H01L 21/00* (2006.01)
*H01L 21/461* (2006.01)
*H01L 21/302* (2006.01)

(52) U.S. Cl.
USPC ................... 438/41; 438/22; 438/40; 438/42; 438/47; 438/751; 257/E21.034; 257/E21.108; 257/E21.117; 257/E33.064

(58) Field of Classification Search
USPC .......... 438/22, 40–42, 47, 751; 257/E21.034, 257/E21.108, E21.117, E33.064
See application file for complete search history.

(56) References Cited

U.S. PATENT DOCUMENTS

| | | | |
|---|---|---|---|
| 2003/0087467 A1* | 5/2003 | Oohata et al. .................. | 438/47 |
| 2009/0114928 A1* | 5/2009 | Messere et al. ................ | 257/88 |
| 2009/0162959 A1* | 6/2009 | Hsu et al. ....................... | 438/33 |
| 2009/0291518 A1* | 11/2009 | Kim et al. ...................... | 438/33 |
| 2012/0142133 A1* | 6/2012 | Tu et al. ......................... | 438/42 |
| 2012/0171791 A1* | 7/2012 | Tu et al. ......................... | 438/33 |

* cited by examiner

*Primary Examiner* — Mohsen Ahmadi
(74) *Attorney, Agent, or Firm* — Altis Law Group, Inc.

(57) ABSTRACT

A method for fabricating a semiconductor lighting chip includes steps of: providing a substrate; forming a first etching layer on the substrate; forming a connecting layer on the first etching layer; forming a second etching layer on the connecting layer; forming a lighting structure on the second etching layer; and etching the first etching layer, the connecting layer, the second etching layer and the lighting structure, wherein an etching rate of the first etching layer and the second etching layer is lager than that of the connecting layer and the lighting structure, thereby to form the connecting layer and the lighting structure each with an inverted frustum-shaped structure.

11 Claims, 5 Drawing Sheets

METHOD FOR FABRICATING SEMICONDUCTOR LIGHTING CHIP

1. TECHNICAL FIELD

The disclosure generally relates to a method for fabricating a semiconductor lighting chip.

2. DESCRIPTION OF RELATED ART

In recent years, due to excellent light quality and high luminous efficiency, light emitting diodes (LEDs) have increasingly been used as substitutes for incandescent bulbs, compact fluorescent lamps and fluorescent tubes as light sources of illumination devices.

The LED generally includes a lighting chip, which includes an n-type semiconductor layer, an active layer and a p-type semiconductor layer sequentially formed on a substrate. When a voltage is applied between the n-type semiconductor layer and the p-type semiconductor layer, hole-electron recombination will happen at the active layer, and energy is released in the form of light.

In order to improve luminescent efficiency of the lighting chip, the lighting chip is etched to form an inverted frustum-shaped structure, in which a width of the lighting chip gradually decreases from an upper surface to a bottom surface thereof. Therefore, more light will travel to the external environment through inclined sidewalls of the lighting chip. However, the conventional etching of the lighting chip is time consuming.

Therefore, a method for fabricating a semiconductor lighting chip is desired to overcome the above described shortcoming.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

An embodiment of a method for fabricating a semiconductor lighting chip will now be described in detail below and with reference to the drawings.

Figure 1:
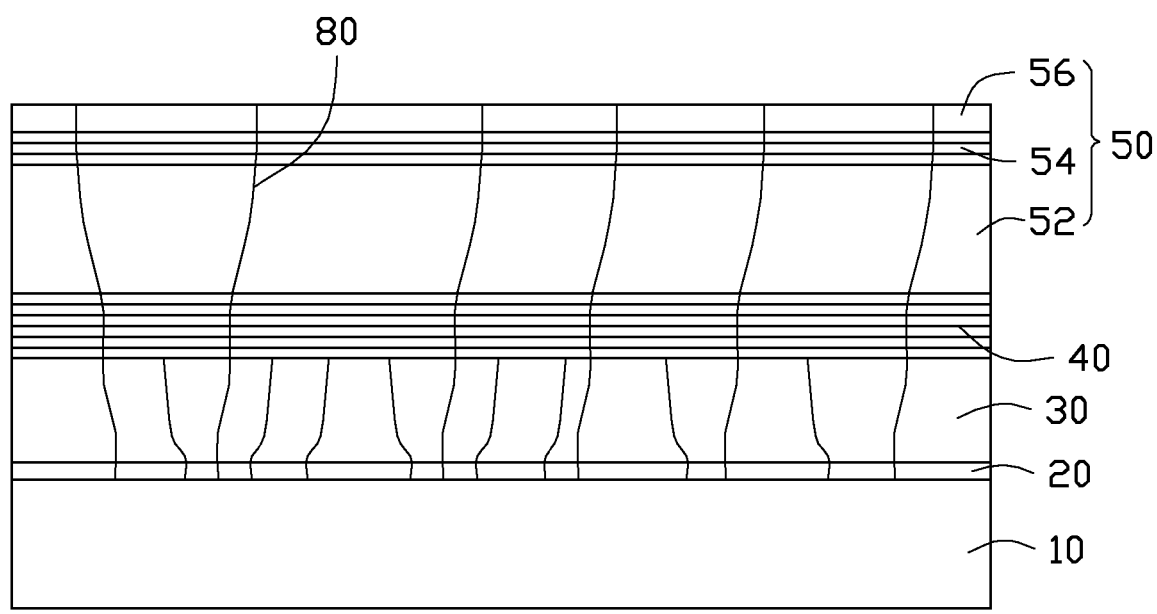
FIG. 1 is a cross-sectional view of a lighting chip before etching.
Figure 2:
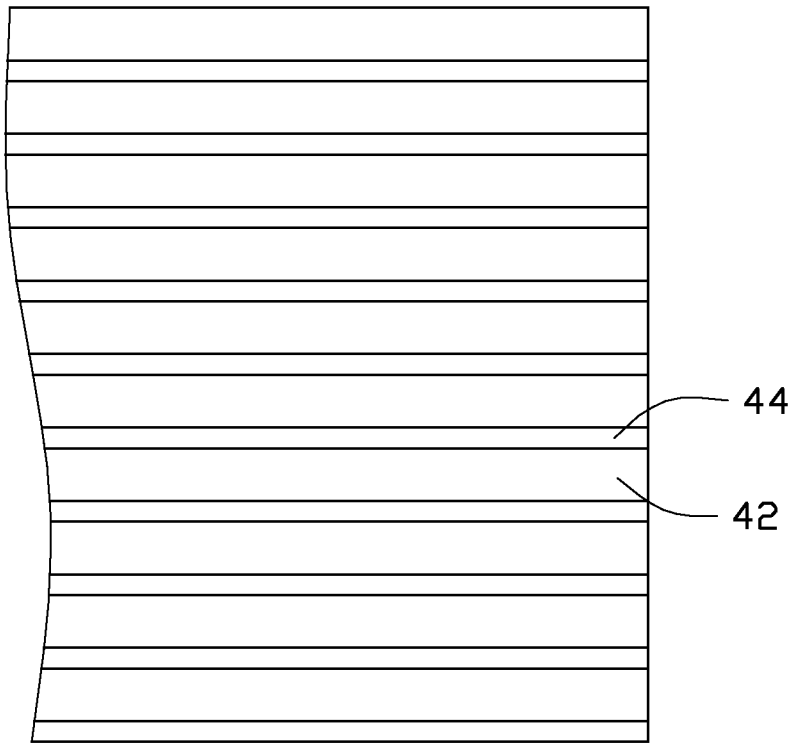
FIG. 2 is an enlarged partial view of a second etching layer in FIG. 1.

Referring to FIGS. 1-2, a substrate 10 is firstly provided. Material of the substrate 10 can be selected from a group consisting of Si, SiC, GaN and sapphire. In this embodiment, the substrate 10 is made of sapphire.

A first etching layer 20 is formed on an upper surface of the substrate 10 by metal organic chemical vapor deposition (MOCVD), molecular beam epitaxy (MBE) or hydride vapor phase epitaxy (HYPE). In this embodiment, the first etching layer 20 is a low temperature buffer layer made of GaN or AlN, and has a thickness about 20 nm.

After that, a connecting layer 30 is formed on an upper surface of the first etching layer 20. In this embodiment, the connecting layer 30 is a non-doping GaN layer, which has a thickness about 1 μm.

A second etching layer 40 is then formed on an upper surface of the connecting layer 30. In this embodiment, the second etching layer 40 is a super lattice layer consisting of a number of GaN layers 42 and a number of AlN layers 44 alternating with each other. A thickness of each GaN layer 42 is about 40 nm, and a thickness of each AlN layer 44 is about 20 nm. In this embodiment, the second etching layer 40 includes ten GaN layers 42 and ten AlN layers 44; therefore, a total thickness of the second etching layer 40 is about 0.6 μm.

A lighting structure 50 is then formed on an upper surface of the second etching layer 40. The lighting structure 50 includes a first semiconductor layer 52, an active layer 54 and a second semiconductor layer 56 sequentially formed on the second etching layer 40. In this embodiment, the first semiconductor layer 52 is an n-type GaN layer, which has a thickness of about 3 μm. The active layer 54 is a multiple quantum well (MQW) GaN layer, which has a thickness of about 145 nm. The second semiconductor layer is a p-type semiconductor layer, which has a thickness of about 0.1 μm.

Figure 3:
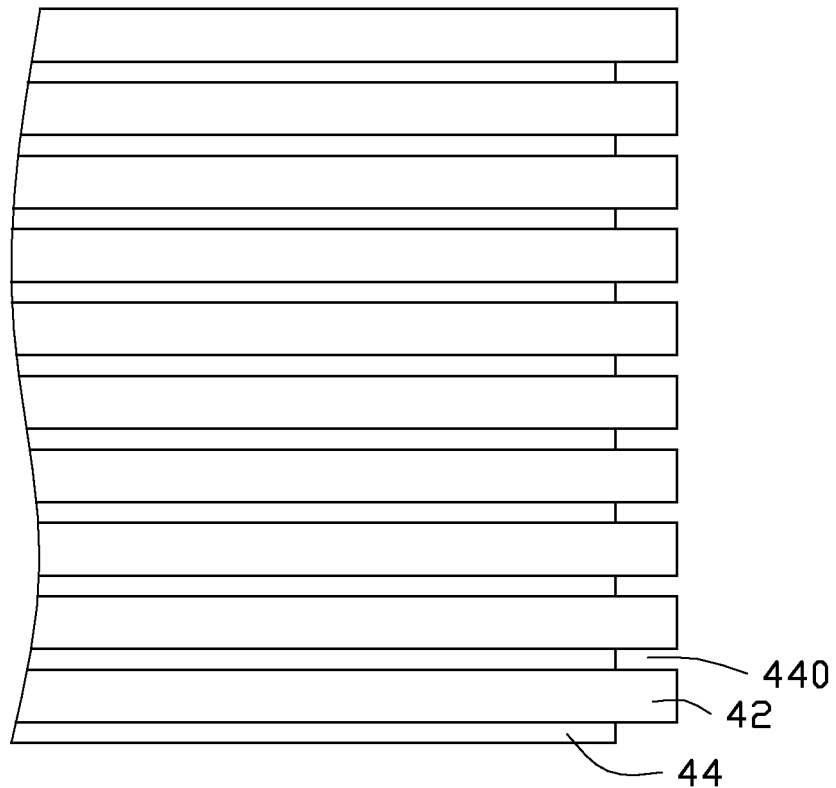
FIG. 3 is a cross-sectional view of the second etching layer in FIG. 2, after etching for a first time period.
Figure 4:
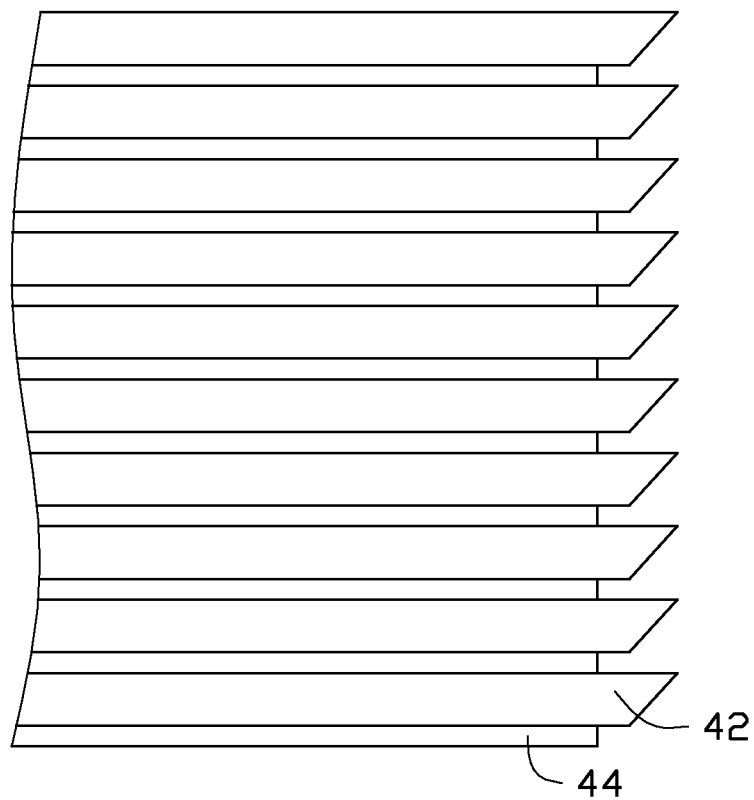
FIG. 4 is a cross-sectional view of the second etching layer in FIG. 3, after etching for a second time period.
Figure 5:
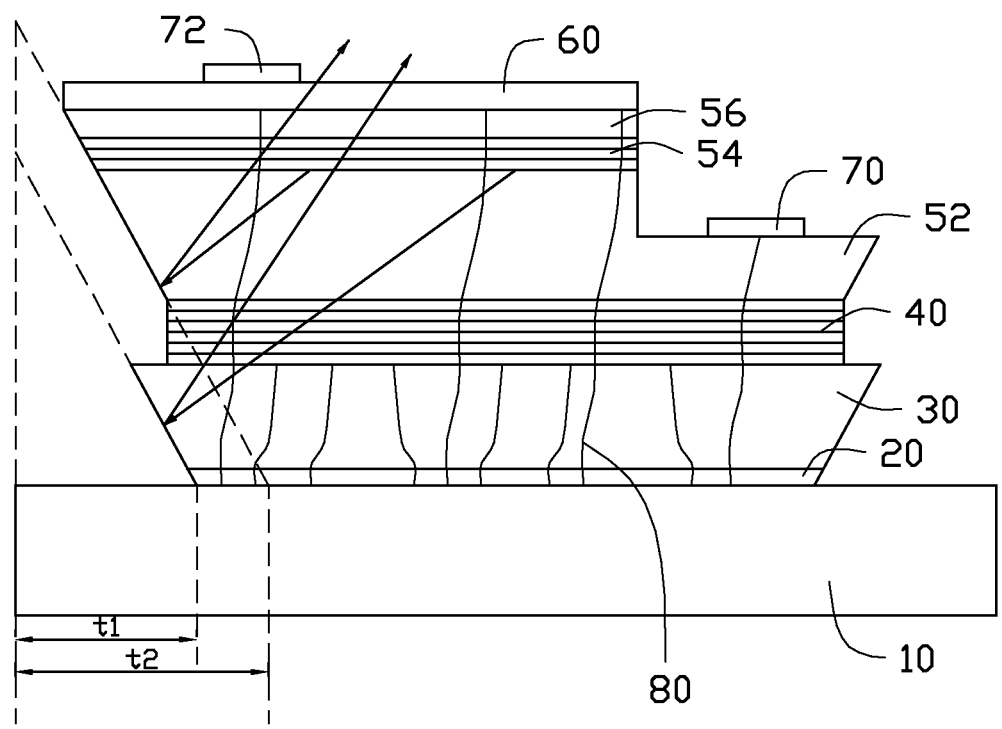
FIG. 5 is a cross-sectional view of the lighting chip in FIG. 1 after completion of the etching.

Referring also to FIGS. 3-5, the first etching layer 20, the connecting layer 30, the second latching layer 40, and the lighting structure 50 are then etched by KOH solution at a temperature of 90° C. for 5-10 minutes. Because the AlN layer is easier to etch than the GaN layer, the etching of the first etching layer 20 and the second etching layer 40 by the KOH solution is faster than that of the connecting layer 30. Therefore, the first etching layer 20 and the second etching layer 40 are firstly etched, clearances are formed between the bottom surface of the connecting layer 30 and the upper surface of the substrate 10, and clearances are also formed between the bottom surface of the lighting structure 50 and the upper surface of the connecting layer 30. Therefore, the bottom surfaces of the lighting structure 50 and the connecting layer 30 are exposed to the external environment. The KOH solution will etch the lighting structure 50 and the connecting layer 30 from the plane (000-1), thereby forming inclined sidewalls of the lighting structure 50 and the connecting layer 30 with an inclined angle relative to a horizontal plane (i.e., a plane parallel to the upper surface of the substrate 10) between 57 degrees and 62 degrees.

In addition, during etching the AlN layers 44, etching of the AlN layers 44 by the KOH solution is faster than that of the GaN layers 42, whereby the KOH solution will etch the AlN layers 44 and form clearances 440 at two lateral sides of the AlN layers 44, therefore exposing lateral edges of the GaN layers 42. Generally, the plane (000-1) of GaN structure has a relatively high surface energy, after the lateral edges of the GaN layers 42 are exposed to the external environment, the KOH solution will etch the GaN layers 42 from the bottom surfaces of the lateral edges and sidewalls of the GaN layers 42 at the same time. Therefore, planes (10-1-1) and (11-2-2) are remained after etching, and an included angle between each of the sidewalls of the GaN layers 42 and a horizontal plane extending from the corresponding bottom surface is in a range from 57 degrees to 62 degrees.

Referring to FIG. 5, after the etching of the lighting structure 50, a transparent conductive layer 60 is formed on an upper surface of the second semiconductor layer 56. A right portion of the lighting structure 50 is etched away to expose a partial surface of the first semiconductor layer 52. A first electrode 70 and a second electrode 72 are then formed on the transparent conductive layer 60 and the first semiconductor layer 52, respectively. The transparent conductive layer 60 can be made of indium-tin oxide or Ni/Au alloy to achieve uniform current distribution in the second semiconductor layer 56.

Because the first etching layer 20 is formed between the connecting layer 30 and the substrate 10, and the second etching layer 40 is formed between the lighting structure 50 and the connecting layer 30, peripheral portions of the first etching layer 20 and the second etching layer 40 can be firstly etched to expose the bottom surfaces of the connecting layer 30 and the lighting structure 50 which will be simultaneously etched after the etching of the first etching layer 20 and the second etching layer 40. Time consumed by the etching process is reduced due to the simultaneous etching of the bottom surfaces of the connecting layer 30 and the lighting structure 50. For example, if the lighting chip is etched only at the bottom of the connecting layer 30, it needs a time of t2 to form a sidewall with a predetermined inclined angle. If the lighting chip is etched simultaneously from the bottom surfaces of the connecting layer 30 and the lighting structure 50, it needs a time t1 to form a side wall with the predetermined inclined angle. Obviously, t1 is less than t2. Generally, the etching time of the lighting chip is adjustable by controlling the position of the second etching layer 40. Specifically, as the smaller the distance between the second etching layer 40 and the active layer 54 is, the less time for etching the lighting chip is needed. Therefore, this method can flexibly control the manufacture period of the lighting chip.

In addition, the second etching layer 40 is a super lattice layer, which can effectively prevent dislocation defects 80 from extending from the connecting layer 30 to the active layer 54, therefore improving luminescent efficiency of the lighting chip. In the conventional technology, because of the lattice mismatch between the connecting layer 30 and the substrate 10, the dislocation defects 80 will be formed in the connecting layer 30 made of GaN. The dislocation defects 80 will extend to the active layer 54 in subsequent epitaxial process, which reduces the hole-electron recombination happening in the active layer 54. In this embodiment, when a supper lattice layer is formed between the connecting layer 30 and the lighting structure 50, the stress in the supper lattice layer will make the dislocation defects 80 change their original direction. Therefore, fewer dislocation defects 80 can extend to the lighting structure 50 and the luminescent efficiency of the lighting chip is improved.

In addition, by etching, the lighting structure 50 forms an inverted frustum-shaped structure in which a width of the lighting structure 50 gradually decreases from the upper surface to the bottom surface thereof. Similarly, the connecting layer 30 forms an inverted frustum-shaped structure in which a width of the lighting structure 50 gradually decreases from the upper surface to the bottom surface thereof. The inverted frustum-shaped structures of the connecting layer 30 and the lighting structure 50 can reflect the lighting from the active layer, therefore improving luminescent efficiency of the lighting chip.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A method for fabricating a semiconductor lighting chip, comprising steps:
   providing a substrate;
   forming a first etching layer on the substrate;
   forming a connecting layer on the first etching layer;
   forming a second etching layer on the connecting layer;
   forming a lighting structure on the second etching layer; and
   etching the first etching layer, the connecting layer, the second etching layer and the lighting structure, wherein an etching rate of the first etching layer and the second etching layer is larger than that of the connecting layer and the lighting structure, thereby to form the connecting layer and the lighting structure each having an inverted frustum-shaped structure;
   wherein when the second etching layer is etched, lateral sides of the second etching layer are etched to form first clearances between the lighting structure and the connecting layer, thereby to expose a bottom surface of the lighting structure;
   wherein when the first etching layer is etched, lateral sides of the first etching layer is etched to form second clearances between the substrate and the connecting layer, thereby to expose a bottom surface of the connecting layer.

2. The method for fabricating a semiconductor lighting chip of claim 1, wherein the first etching layer is a buffer layer.

3. The method for fabricating a semiconductor lighting chip of claim 1, wherein the second etching layer is a super lattice layer.

4. The method for fabricating a semiconductor lighting chip of claim 3, wherein the second etching layer comprises a plurality of GaN layers and a plurality of AlN layers alternatively overlapping each other.

5. The method for fabricating a semiconductor lighting chip of claim 4, wherein a thickness of each of the GaN layers is lager than that of each of the AlN layers.

6. The method for fabricating a semiconductor lighting chip of claim 1, wherein the connecting layer is made of non-doping GaN material.

7. The method for fabricating a semiconductor lighting chip of claim 1, wherein the lighting structure comprises a first semiconductor layer, an active layer and a second semiconductor layer sequentially formed on the second etching layer.

8. The method for fabricating a semiconductor lighting chip of claim 7, wherein after the etching of the first etching layer, the second etching layer, the lighting structure and the connecting layer, a transparent conductive layer is formed on an upper surface of the second semiconductor layer.

9. The method for fabricating a semiconductor lighting chip of claim 8, wherein a part of the lighting structure is etched away to expose a part of a surface of the first semiconductor layer after the formation of the transparent conductive layer on the upper surface of the second semiconductor layer, a first electrode is formed on the first semiconductor layer, and a second electrode is formed on the transparent conductive layer.

10. The method for fabricating a semiconductor lighting chip of claim 1, wherein an included angle between one of sidewalls of the lighting structure and a horizontal plane is in a range from 57 degrees to 62 degrees.

11. The method for fabricating a semiconductor lighting chip of claim 1, wherein an included angle between one of sidewalls of the connecting layer and a horizontal plane is in a range from 57 degrees to 62 degrees.

* * * * *